(12) United States Patent
Mao et al.

(10) Patent No.: US 9,419,528 B2
(45) Date of Patent: Aug. 16, 2016

(54) TRAILING EDGE DETECTOR USING CURRENT COLLAPSE

(71) Applicant: POWER INTEGRATIONS, INC., San Jose, CA (US)

(72) Inventors: Mingming Mao, Saratoga, CA (US); Ricardo Luis Janezic Pregitzer, Campbell, CA (US); Tiziano Pastore, Los Gatos, CA (US); Michael Yue Zhang, Mountain View, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 14/937,662

(22) Filed: Nov. 10, 2015

(65) Prior Publication Data
US 2016/0079867 A1    Mar. 17, 2016

Related U.S. Application Data (63) Continuation of application No. 14/322,760, filed on Jul. 2, 2014, now Pat. No. 9,214,851.

(51) Int. Cl.
*H02M 3/00* (2006.01)
*H02M 3/335* (2006.01)
(Continued)

(52) U.S. Cl.
CPC ............ *H02M 3/33507* (2013.01); *H02M 1/08* (2013.01); *H03K 5/1534* (2013.01); *H05B 33/0815* (2013.01)

(58) Field of Classification Search
CPC ........... H05B 33/0815; H05B 33/0809; H05B 33/0887; H02M 3/33507; H02M 1/08; H02M 5/257; H02M 5/2573; H02M 5/293
See application file for complete search history.

(56) References Cited

U.S. PATENT DOCUMENTS

| 7,787,262 B2 * | 8/2010 | Mangtani .......... H02M 3/33507 363/18 |
| 2006/0250827 A1 * | 11/2006 | Chu .................. H02M 3/33507 363/21.12 |

(Continued)

FOREIGN PATENT DOCUMENTS

| EP | 2590477 A1 | 5/2013 |
| WO | WO 2011/114261 A1 | 9/2011 |

OTHER PUBLICATIONS

EP 15174210.3—European Search Report, dated Feb. 18, 2016, 4 pages.

(Continued)

*Primary Examiner* — Adolf Berhane
*Assistant Examiner* — Henry Lee, III
(74) *Attorney, Agent, or Firm* — Blakely Sokoloff Taylor & Zafman LLP (57) ABSTRACT

A controller for a power converter includes an edge detection circuit including a first circuit coupled to coupled to compare a voltage sense signal representative of an input voltage to a first reference, and a second circuit coupled to compare a current sense signal representative of an input current to a second reference. A slope sense circuit is coupled to measure a slope of the voltage sense signal over time. An edge driver circuit is coupled to generate an edge signal that indicates that an edge has been determined when the voltage sense signal is greater than the first reference, the current sense signal is lower than the second reference, and the slope is negative. A drive circuit is coupled to output a drive signal in response to the edge signal. The drive signal is for controlling a switch coupled to regulate an output of the power converter.

7 Claims, 5 Drawing Sheets

(51) Int. Cl.
*H02M 1/08* (2006.01)
*H05B 33/08* (2006.01)
*H03K 5/1534* (2006.01)

(56) References Cited

U.S. PATENT DOCUMENTS

| | | | |
|---|---|---|---|
| 2008/0259656 A1* | 10/2008 | Grant | H02M 3/33523 363/21.18 |
| 2009/0147548 A1* | 6/2009 | Chang | H02M 3/33507 363/21.18 |
| 2012/0104970 A1 | 5/2012 | Okubo et al. | |
| 2012/0176055 A1 | 7/2012 | Hong et al. | |
| 2012/0188794 A1 | 7/2012 | Chang et al. | |
| 2013/0113391 A1 | 5/2013 | Mercier et al. | |
| 2013/0278159 A1 | 10/2013 | Del Carmen, Jr. et al. | |
| 2013/0343090 A1 | 12/2013 | Eom et al. | |
| 2014/0062322 A1* | 3/2014 | Yu | H05B 33/0815 315/200 R |
| 2014/0239840 A1 | 8/2014 | Wang et al. | |

OTHER PUBLICATIONS

EP 15174210.3—European Office Action, dated Mar. 2, 2016, 7 pages.

* cited by examiner

TRAILING EDGE DETECTOR USING CURRENT COLLAPSE

CROSS-REFERENCE TO RELATED APPLICATIONS

This application is a continuation of U.S. patent application Ser. No. 14/322,760, filed Jul. 2, 2014, now pending. U.S. patent application Ser. No. 14/322,760 is hereby incorporated by reference.

BACKGROUND INFORMATION

1. Field of the Disclosure

The present invention relates generally to power converters, and more specifically to power converters utilized with dimmer circuits.

2. Background

Residential and commercial lighting applications often include dimmers vary the brightness of the outputted light. A dimmer circuit typically disconnects a portion of the ac input voltage to limit the amount of voltage and current supplied to an incandescent lamp. This is known as phase dimming because it is often convenient to designate the position of the dimmer circuit and the resultant amount of missing voltage in terms of a fraction of the period of the ac input voltage measured in degrees. In general, the ac input voltage is a sinusoidal waveform and the period of the ac input voltage is referred to as a full line cycle. As such, half the period of the ac input voltage is referred to as a half line cycle. An entire period has 360 degrees, and a half line cycle has 180 degrees. Typically, the phase angle is a measure of how many degrees (from a reference of zero degrees) of each half line cycle the dimmer circuit disconnects. On the other hand, the conduction angle is a measure of how many degrees (from a reference of zero degrees) of each half line cycle the dimmer circuit does not disconnect a portion the ac input voltage. Or in other words, the conduction angle is a measure of how many degrees of each half line cycle in which the dimmer circuit is conducting. In one example, the removal of a quarter of the ac input voltage in a half line cycle may correspond to a phase angle of 45 degrees but a conduction angle of 135 degrees.

Although phase angle dimming works well with incandescent lamps that receive the altered ac input voltage directly, it typically creates problems for light emitting diode (LED) lamps. LED lamps often require a regulated power converter to provide regulated current and voltage from the ac power line. Most LEDs and LED modules are best driven by a regulated current which a regulated power converter may provide from an ac power line. Dimmer circuits typically don't work well with conventional regulated power converters and their respective controllers. Regulated power converters are typically designed to ignore distortions of the ac input voltage and to deliver a constant regulated output. As such, conventional regulated power supplies would not satisfactorily dim the LED lamp. Unless a power converter for an LED lamp is specially designed to recognize and respond to the voltage from a dimmer circuit in a desirable way, a dimmer is likely to produce unacceptable results such as flickering or shimmering of the LED lamp with large conduction angles and flashing of the LED lamp at low conduction angles.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of a power converter controller and a method of operating the power converter controller are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For phase dimming applications, including those for light emitting diodes (LED), a dimmer circuit typically disconnects a portion of the ac input voltage at every half line cycle to limit the amount of voltage and current supplied to the LEDs. Dimmer circuits may be categorized as a leading edge dimmer circuit or a trailing edge dimmer circuit. For a leading edge dimmer circuit, in general the input voltage is substantially zero at the beginning of a half line cycle until the dimmer circuit conducts and the input voltage rapidly increases and follows the ac input voltage. For a trailing edge dimmer circuit, the input voltage substantially follows the ac input voltage at the beginning of the half line cycle until the dimmer circuit does not conduct and the input voltage rapidly decreases to substantially zero. The rapid increase or decrease may be referred to as an "edge."

A power converter designed to respond to a dimmer circuit may determine the amount of dimming set by the dimmer circuit and control the amount of voltage and current supplied to the LEDs. The amount of dimming (i.e. phase angle or conduction angle) may be determined by measuring the amount of time which the ac input voltage is disconnected or not disconnected (i.e., the amount of time which the dimmer circuit is not conducting or conducting, respectively). In one example, the conduction angle (or phase angle) may be measured by threshold detection where the input voltage may be compared to a reference threshold. The amount of time which the input voltage is above the reference may correspond to the conduction while the amount of time which the input voltage is below the reference may correspond to the phase angle. However, utilizing threshold detection may be inaccurate due to leakage current of the dimmer circuit in its off-state that prevents voltage across the power converter input capacitors to fall to substantially zero.

In one example of the present invention, an edge detection circuit may be utilized to determine if the dimmer circuit is not conducting. Once an edge is detected, the conduction angle (or phase angle) may be measured. For examples of the present invention, the edge detection circuit may determine if a trailing edge is detected if the input voltage is greater than a reference voltage, the input current is less than a reference current, and the bleeder circuit is enabled. In addition, the trailing edge is detected if the amplitude of the input voltage has a negative slope.

Figure 1:
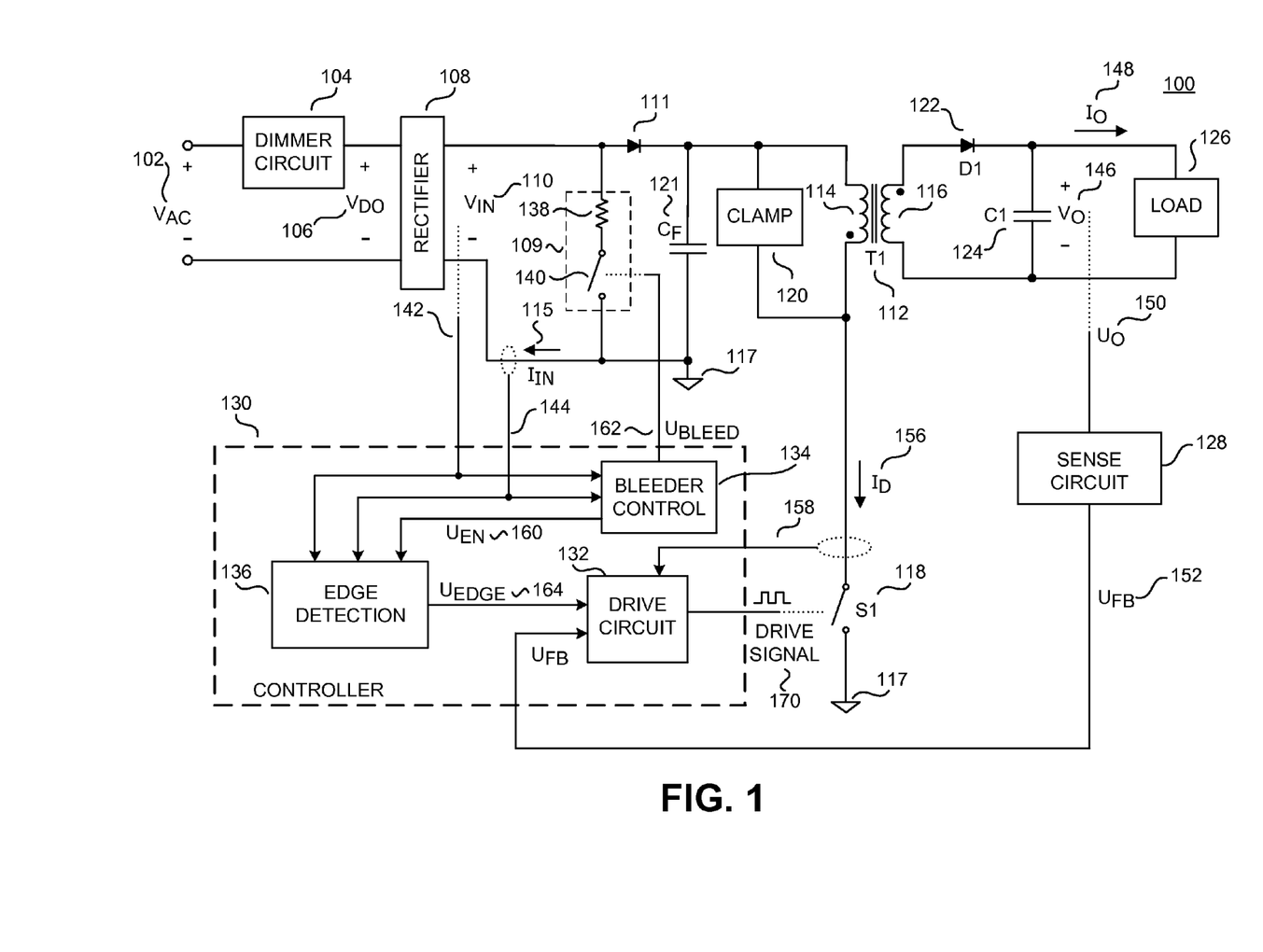
FIG. 1 is a functional block diagram illustrating an example power converter with a dimmer circuit utilizing a controller in accordance with an example of the present invention.

Referring first to FIG. 1, a functional block diagram of an example power converter 100 is illustrated including ac input voltage $V_{AC}$ 102, a dimmer circuit 104, a dimmer output voltage $V_{DO}$ 106, a rectifier 108, a bleeder circuit 109, an input voltage $V_{IN}$ 110, a diode 111, an energy transfer element T1 112, a primary winding 114 of the energy transfer element T1 112, a secondary winding 116 of the energy transfer element T1 112, an input current $I_{IN}$ 115, a switch S1 118, input return 117, a clamp circuit 120, a rectifier D1 122, an input capacitor CF 121, an output capacitor C1 124, a load 126, a sense circuit 128, and a controller 130. Controller 130 further includes a drive circuit 132, a bleeder control circuit 134, and an edge detection circuit 136. Bleeder circuit 109 further includes resistance 138 and switch 140. In one example, sense circuit 128 may also be included in controller 130. FIG. 1 further illustrates an input voltage sense signal 142, an input current sense signal 144, output voltage $V_O$ 146, an output current $I_O$ 148, an output quantity $U_O$ 150, a feedback signal $U_{FB}$ 152, a switch current $I_D$ 156, a switch current sense signal 158, an enable signal $U_{EN}$ 160, and an edge signal $U_{EDGE}$ 164. Although a single controller is illustrated in FIG. 1, it should be appreciated that multiple controllers may be utilized. In addition, the drive circuit 132, bleeder control circuit 134, and edge detection circuit 136 need not be within a single controller. For example, the power converter 100 may have a primary and a secondary controller coupled to the input and the output side, respectively, of the power converter 100. The example switched mode power converter 100 illustrated in FIG. 1 is coupled in a flyback configuration, which is just one example of a switched mode power converter that may benefit from the teachings of the present invention. It is appreciated that other known topologies and configurations of the switched mode power converter may also benefit from the teachings of the present invention.

The power converter 100 provides output power to the load 126 from an unregulated ac input voltage $V_{AC}$ 102. As shown, dimmer circuit 104 receives the ac input voltage $V_{AC}$ 102 and produces the dimmer output voltage $V_{DO}$ 106. The dimmer circuit 104 may be utilized to limit the voltage delivered to the power converter 100. In one embodiment, the dimmer circuit 104 may be a phase dimming circuit such as a triac phase dimmer. The dimmer circuit 104 further couples to the rectifier 108 and the dimmer output voltage $V_{DO}$ 106 is received by the rectifier 108. The rectifier 108 outputs the input voltage $V_{IN}$ 110. In one embodiment, rectifier 108 may be a bridge rectifier. The rectifier 108 further couples to the bleeder circuit 109 and the diode 111. The other end of diode 111 is further coupled to the energy transfer element T1 112. In some embodiments of the present invention, the energy transfer element T1 112 may be a coupled inductor or may be a transformer. As shown, the energy transfer element T1 112 includes two windings, a primary winding 114 and a secondary winding 116. However, the energy transfer element T1 112 may have more than two windings. The primary winding 114 may be considered an input winding, and secondary winding 116 may be considered an output winding. The primary winding 114 is further coupled to switch S1 118, which is then further coupled to input return 117. The clamp circuit 120 is illustrated in the example of FIG. 1 as being coupled across the primary winding 114 of the energy transfer element T1 112. The filter capacitor CF 121 may couple across the primary winding 114 and switch S1 118. In other words, the filter capacitor CF 121 may be coupled across the diode 111 and the bleeder circuit 109. As illustrated, the bleeder circuit may include a resistance 138 and a switch 140. The resistance 138 is coupled to the diode 111 while the switch 140 is coupled to input return 117.

Secondary winding 116 of the energy transfer element T1 112 is coupled to the rectifier D1 122. In the example of FIG. 1, the rectifier D1 122 is exemplified as a diode. However, in some examples the rectifier D1 122 may be a transistor used as a synchronous rectifier. Both the output capacitor C1 124 and the load 126 are shown in FIG. 1 as being coupled to the rectifier D1 122. An output is provided to the load 126 and may be provided as either a regulated output voltage $V_O$ 146, regulated output current $I_O$ 148, or a combination of the two. In one embodiment, the load 126 may be a light emitting diode (LED) array.

The power converter 100 further comprises circuitry to regulate the output, exemplified as output quantity $U_O$ 150. In general, the output quantity $U_O$ 150 is either an output voltage $V_O$ 146, an output current $I_O$ 148, or a combination of the two. A sense circuit 128 is coupled to sense the output quantity $U_O$ 150 and to provide feedback signal $U_{FB}$ 152, which is representative of the output quantity $U_O$ 150. Feedback signal $U_{FB}$ 152 may be a voltage signal or a current signal. In one example, the sense circuit 128 may sense the output quantity $U_O$ 150 from an additional winding included in the energy transfer element T1 112. In a further example, the sense circuit 128 may utilize a voltage divider to sense the output quantity $U_O$ 150 from the output of the power converter 100.

Controller 130 is coupled to the sense circuit 128 and receives the feedback signal $U_{FB}$ 152. The controller 130 further includes terminals for receiving the input voltage sense signal 142 (representative of the input voltage $V_{IN}$ 110), input current sense signal 144 (which is representative of the input current $I_{IN}$ 115), switch current sense signal 158 (representative of the switch current $I_D$ 156) and for providing the drive signal 170 to power switch S1 118. In the example of FIG. 1, the input voltage sense signal 142 is representative of input voltage $V_{IN}$ 110. However, in other examples the input voltage sense signal 142 may be representative of the dimmer output voltage $V_{DO}$ 106. The input voltage sense signal 142, input current sense signal 144, and the switch current sense signal 158 may be voltage signals or current signals. Controller 130 provides drive signal 170 to the power switch S1 118 to control various switching parameters to control the transfer of energy from the input of power converter 100 to the output of power converter 100. The controller 130 also provides the bleeder control signal $U_{BLEED}$ 162 to switch 140 to control when the bleeder circuit 109 provides bleeding for the power converter 100.

As illustrated in the example of FIG. 1, the controller 130 includes the drive circuit 132, bleeder control circuit 134, and the edge detection circuit 136. The drive circuit is coupled to output the drive signal 170 in response to the one or more outputs of the edge detection circuit 136 and/or the feedback signal $U_{FB}$ 152. In addition, drive circuit 132 may also be coupled to be responsive to the current sense signal 158. Bleeder control circuit 134 is coupled to receive the input voltage sense signal 142, input current sense signal 144, and output the bleeder control signal $U_{BLEED}$ 162. In addition, the bleeder control circuit 134 also outputs an enable signal $U_{EN}$ 160 to the edge detection circuit 136. The enable signal $U_{EN}$ 160 may be a voltage signal or a current signal and is representative of when the bleeder circuit 109 is enabled. Edge detection circuit 136 is coupled to receive the input voltage sense signal 142, input current sense signal 144, and the enable signal $U_{EN}$ 160 and output the edge signal $U_{EDGE}$ 164. The edge signal $U_{EDGE}$ 164 may be a voltage signal or a current signal and is representative of whether an edge is detected. In particular, if a trailing edge is detected.

In operation, the power converter 100 of FIG. 1 provides output power to the load 126 from an unregulated input (i.e. ac input voltage $V_{AC}$ 102). The dimmer circuit 104 may be utilized to limit the amount of voltage delivered to the power converter. For the example of a LED load, when the dimmer circuit 104 limits the amount of voltage delivered to the power converter, the resultant current delivered to the load of LED arrays is also limited and the LED array dims. For leading edge dimming, the dimmer circuit 104 disconnects the ac input voltage $V_{AC}$ 102 when the ac input voltage $V_{AC}$ 102 crosses zero voltage. After a given amount of time, the dimmer circuit 104 reconnects the ac input voltage $V_{AC}$ 102 with the power converter 100. The amount of time before the dimmer circuit reconnects the ac input voltage $V_{AC}$ 102 is set by a user. For trailing edge dimming, the dimmer circuit 104 connects the input to the power converter when the ac input voltage $V_{AC}$ 102 crosses zero voltage. After a given amount of time set by a user, the dimmer circuit 104 then disconnects the ac input voltage $V_{AC}$ 102 for the remainder of the half cycle. Depending on the amount of dimming wanted the dimmer circuit 104 controls the amount of time the ac input voltage $V_{AC}$ 102 is disconnected from the power converter. In general, the more dimming desired corresponds to a longer period of time during which the dimming circuit 104 disconnects the ac input voltage $V_{AC}$ 102.

The dimmer circuit 104 produces the dimmer output voltage $V_{DO}$ 106 which is received and rectified by rectifier 108. The result is the input voltage $V_{IN}$ 110. The filter capacitor CF 121 filters the high frequency current from the switch S1 118. Diode 111 is coupled as a blocking diode to prevent current from flowing from the filter capacitor CF 121 to the bleeder circuit 109. In general, when the dimmer circuit 104 is conducting, the current through the dimmer circuit 104 is held above a threshold. The bleeder circuit 109 provides additional current to keep the current through the dimmer circuit 104 above the threshold. In another example, the current through the dimmer circuit 104 is held above the threshold to provide sufficient loading current for the dimmer circuit 104. The resistance 138 may provide additional current when the bleeder circuit 109 is enabled and the switch 140 is on. It is generally understood that a switch that is closed may conduct current and is considered on, while a switch that is open cannot conduct current and is considered off. Switch 140 is opened and closed in response to the bleed control signal $U_{BLEED}$ 162.

The switching power converter 100 utilizes the energy transfer element T1 112 to transfer voltage between the primary 114 and the secondary 116 windings. The clamp circuit 120 is coupled to the primary winding 114 to limit the maximum voltage on the switch S1 118. Switch S1 118 is opened and closed in response to the drive signal 170. In one example, the switch S1 118 (and switch 140) may be a transistor such as a metal-oxide-semiconductor field-effect transistor (MOSFET). In another example, controller 130 may be implemented as a monolithic integrated circuit or may be implemented with discrete electrical components or a combination of discrete and integrated components. Controller 130 and switch S1 118 could form part of an integrated circuit that is manufactured as either a hybrid or monolithic integrated circuit. In operation, the switching of the switch S1 118 produces a pulsating current at the rectifier D1 122. The current in the rectifier D1 122 is filtered by the output capacitor C1 124 to produce a substantially constant output voltage $V_O$ 146, output current $I_O$ 148, or a combination of the two at the load 126.

The sense circuit 128 senses the output quantity $U_O$ 150 of the power converter 100 to provide the feedback signal $U_{FB}$ 152 to the controller 130. The feedback signal $U_{FB}$ 152 provides information regarding the output quantity $U_O$ 150 to the controller 130. The drive circuit 132 controls various switching parameters (such as switch on-time, switch off-time, duty ratio, or the number of pulses per unit time) of the switch S1 118 through the drive signal 170 in response to the feedback signal $U_{FB}$ 152 and the edge signal $U_{EDGE}$ 164. The drive circuit 132 may also alter the drive signal 170 in response to the switch current sense signal 158. The switch current $I_D$ 156 and the input current $I_{IN}$ 115 may be sensed in a variety of ways, such as for example the voltage across a discrete resistor or the voltage across a transistor when the transistor is conducting. In addition, the controller 130 may receive the input voltage sense signal 142 and the input voltage $V_{IN}$ 110 may be sensed through a resistor divider.

Bleeder control circuit 134 is coupled to output the bleeder control signal $U_{BLEED}$ 162 in response to the input voltage sense signal 142 and the input current sense signal 144. The enable signal $U_{EN}$ 160 is generated in response to the input voltage sense signal 142. Edge detection circuit 136 is coupled to output the edge signal $U_{EDGE}$ 164 in response to the input voltage sense signal 142, input current sense signal 144, and the enable signal $U_{EN}$ 160 if an edge is detected.

Figure 2:
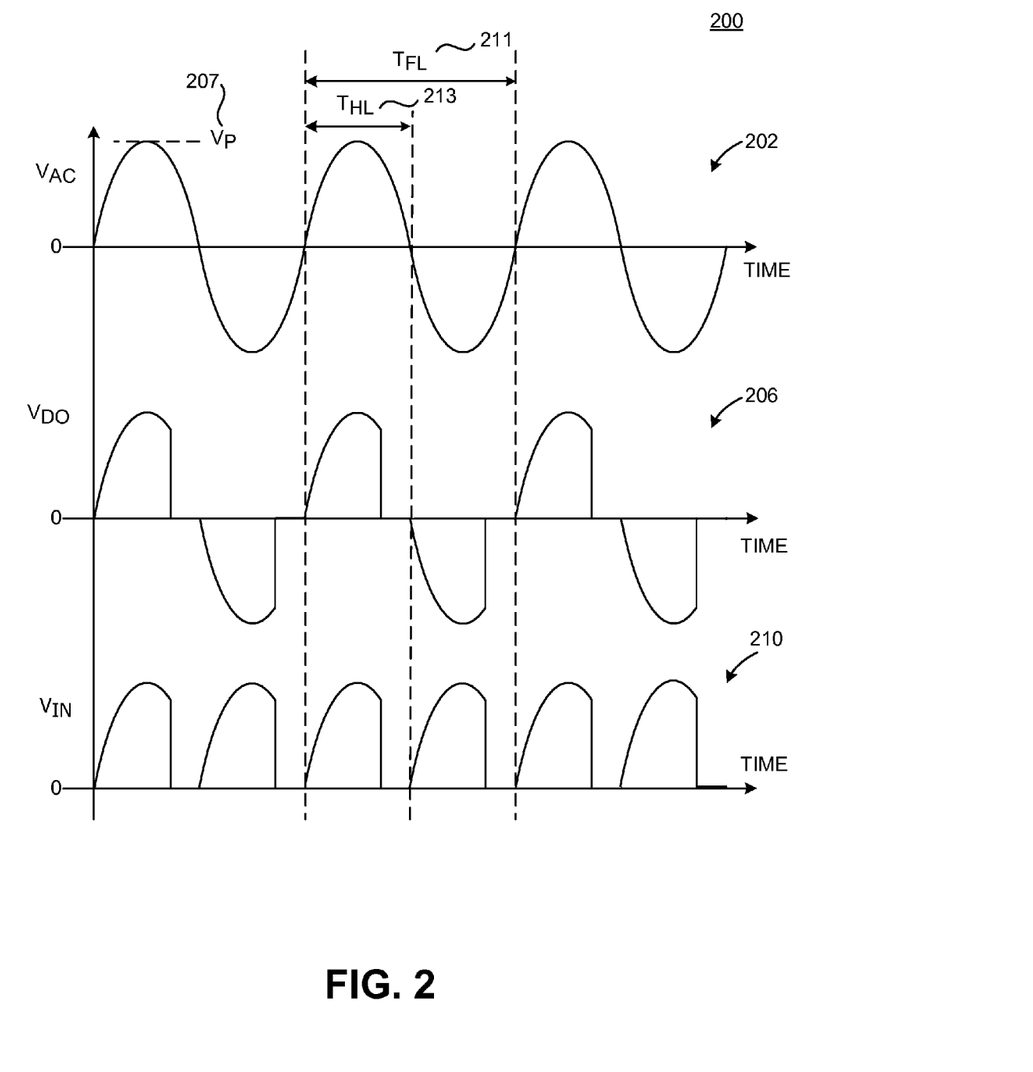
FIG. 2 is a diagram illustrating example waveforms of an ac input voltage, an output voltage of a dimmer circuit, and an output of a rectifier circuit of FIG. 1 in accordance with an example of the present invention.

FIG. 2 illustrates example waveforms of an ac input voltage 202, a dimmer output voltage $V_{DO}$ 206, and an input voltage $V_{IN}$ 210. In particular, FIG. 2 illustrates the dimmer output voltage $V_{DO}$ 206 and resultant input voltage $V_{IN}$ 210 for trailing edge dimming.

In general, the ac input voltage $V_{AC}$ 202 is a sinusoidal waveform with the period of the ac input voltage $V_{AC}$ 202 referred to as a full line cycle $T_{FL}$ 211. Mathematically: $V_{AC}=V_P \sin(2\pi f_L t)$. Where $V_P$ 207 is the peak voltage of the ac input voltage $V_{AC}$ and $f_L$ is the frequency of the ac input voltage. It should be appreciated that the full line cycle $T_{FL}$ 211 is the reciprocal of the line frequency $f_L$, or mathematically:

$$T_{FL} = \frac{1}{f_L}.$$

As shown in FIG. 2, a full line cycle $T_{HL}$ 211 of the ac input voltage 202 is denoted as the length of time between every other zero-crossing of the ac input voltage 202. Further, the half line cycle $T_{HL}$ 213 is the reciprocal of double the line frequency, or mathematically:

$$T_{HL} = \frac{1}{2f_L}.$$

As shown, the half line cycle $T_{HL}$ 213 of the ac input voltage $V_{AC}$ 202 is denoted as the length of time between consecutive zero-crossings.

For trailing edge dimming, the ac input voltage $V_{AC}$ 202 is connected to the power converter at the beginning of each half line cycle $T_{HL}$ 213 and the dimmer output voltage $V_{DO}$ 206 substantially follows the ac input voltage $V_{AC}$ 202. After a given amount of time, the dimmer circuit 104 disconnects the ac input voltage $V_{AC}$ 202 from the power converter 100 and the dimmer output voltage $V_{DO}$ 206 is substantially equal to zero for the rest of the half line cycle $T_{HL}$ 213. The rectifier circuit 108 rectifies the dimmer output voltage $V_{DO}$ 206 thus providing the input voltage $V_{IN}$ 210 as shown. Or mathematically: $V_{RECT}=|V_{DO}|$. As shown the dimmer output voltage $V_{DO}$ 206 sharply increases (or decreases) to substantially fall to zero. The sharp decrease is also illustrated in the example waveform of the input voltage $V_{IN}$ 210. The sharp decrease may be referred to as the "edge."

Figure 3:
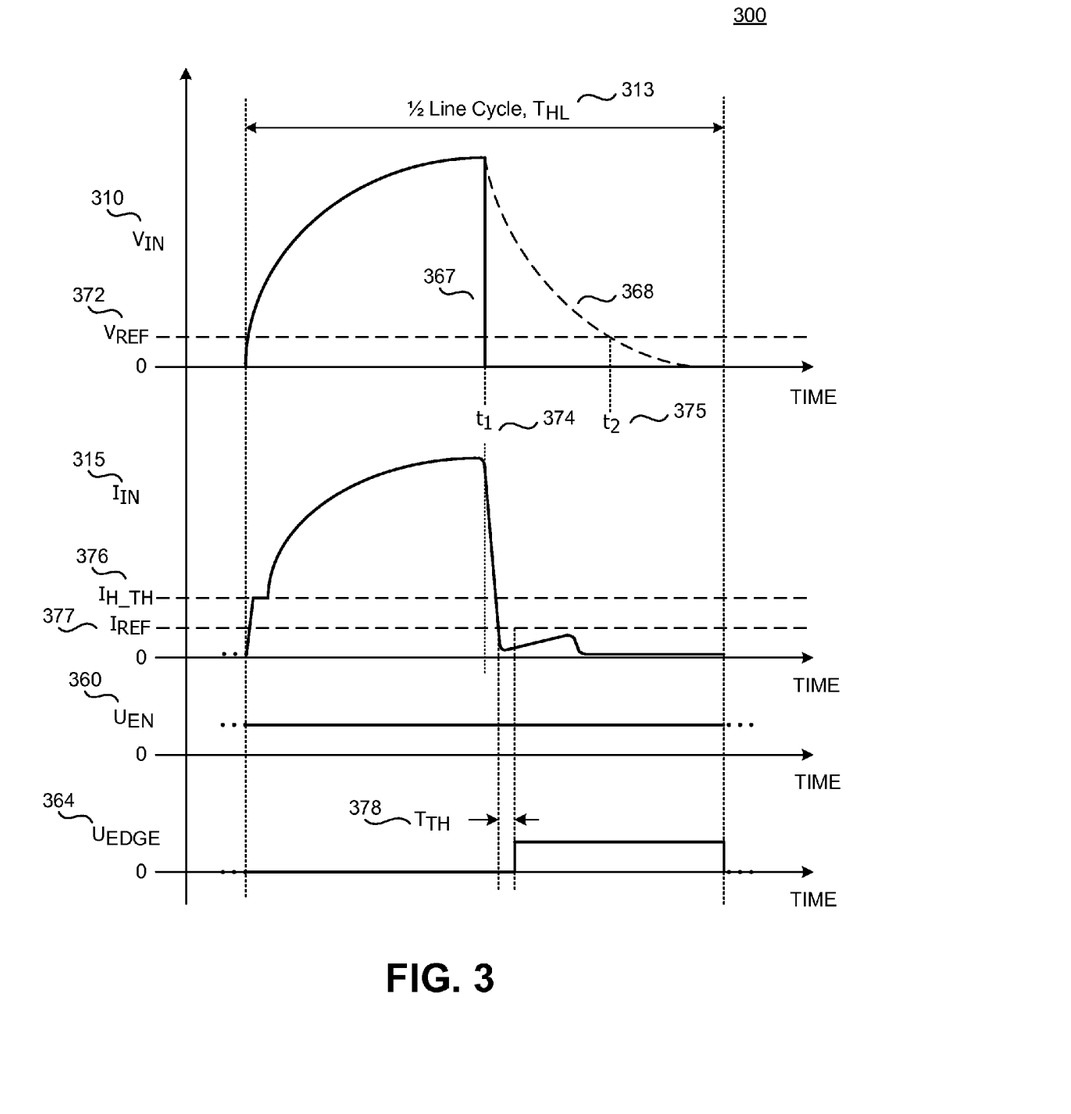
FIG. 3 is a diagram illustrating example waveforms of an input voltage waveform, a zero crossing signal, an input current waveform, and an edge signal of the power converter of FIG. 1 in accordance with an example of the present invention.

Referring next to FIG. 3, example waveforms of the input voltage $V_{IN}$ 310, input current $I_{IN}$ 315, enable signal $U_{EN}$ 360, and the edge signal $U_{EDGE}$ 364 of the switching power converter 100 are illustrated including a first reference $V_{REF}$ 372, a threshold $I_{H\_TH}$ 376, a second reference $I_{REF}$ 377, times $t_1$ 374 and $t_2$ 375, and time threshold $T_{TH}$ 378. FIG. 3 illustrates one half line cycle $T_{HL}$ 313 of the input voltage $V_{IN}$ 310 and input current $I_{IN}$ 315 when the dimmer circuit is disconnecting a portion of the ac input voltage $V_{AC}$ 102 from the power converter 100 utilizing a trailing edge dimmer circuit.

Input voltage $V_{IN}$ 310 substantially follows the sinusoidal shape of the ac input voltage at the beginning of the half line cycle $T_{HL}$ 313. At time $t_1$ 374, the dimmer circuit 104 disconnects the ac input voltage from the power converter and the input voltage $V_{IN}$ 310 falls to substantially zero. Threshold detection may be utilized to determine when the dimmer circuit is or is not conducting by comparing the input voltage $V_{IN}$ 310 to first reference $V_{REF}$ 372. The amount of time which the input voltage $V_{IN}$ 310 is above the first reference $V_{REF}$ 372 may correspond to the dimmer circuit conducting (and vice versa). Edge 367 illustrates a close to ideal response of the input voltage $V_{IN}$ 310. As illustrated, edge 367 falls quickly to zero at time $t_1$ 374 and the input voltage $V_{IN}$ 310 is less than the first reference $V_{REF}$ 372 at time $t_1$ 374. However, in general, the input voltage $V_{IN}$ 310 does not fall to zero as quickly as illustrated by edge 367. Rather, the input voltage $V_{IN}$ 310 may fall to zero as shown by edge 368 due to leakage current of the dimmer circuit and input voltage $V_{IN}$ 310 does not actually reach the first reference $V_{REF}$ 372 until time $t_2$ 375, which is after the dimmer circuit has stopped conducting at time $t_1$ 374. In another example, the input voltage $V_{IN}$ 310 may slowly decrease once the dimmer circuit 104 stops conducting then quickly decrease once the input current $I_{IN}$ 315 has fallen below the threshold $I_{H\_TH}$ 376 and the switch 140 of the bleeder circuit 109 is turned on. As such, the input voltage $V_{IN}$ 310 does not actually reach the first reference $V_{REF}$ 372 until after time $t_1$ 374. As such, determining the dimmer circuit conduction may be less accurate utilizing threshold detection alone.

In examples of the present invention, the edge detection circuit 136 may also determine if an edge has occurred using the input current $I_{IN}$ 315. At the beginning of the half line cycle $T_{HL}$ 313, the dimmer circuit 104 is conducting and the enable signal $U_{EN}$ 360 is logic high and the bleeder control circuit 134 is enabled. The input current $I_{IN}$ 315 quickly rises to the threshold $I_{H\_TH}$ 376 and is clamped at the threshold $I_{H\_TH}$ 376 until there is enough input voltage $V_{IN}$ 310 and the input current $I_{IN}$ 315 substantially follows the sinusoidal shape of the input voltage $V_{IN}$ 310. At time $t_1$ 374, the dimmer circuit 104 stops conducting and the input current $I_{IN}$ 315 begins to respond to the lack of conduction by the dimmer circuit 104 by decreasing. As illustrated, the input current $I_{IN}$ 315 decreases much quicker than edge 368 of the input voltage $V_{IN}$ 310, as illustrated. The edge detection circuit 136 may output the edge signal $U_{EDGE}$ 364 in response to the input voltage $V_{IN}$ 310, input current $I_{IN}$ 315 and the enable signal $U_{EN}$ (not shown). Utilizing the input voltage $V_{IN}$ 310 with edge 368, after time $t_1$ 374 and before time $t_2$ 375, the slope of the input voltage is negative and the input voltage $V_{IN}$ 310 is greater than the first reference $V_{REF}$ 372. The edge signal $U_{EDGE}$ 364 then transitions to a logic high value after the input current $I_{IN}$ 315 has fallen below the second reference $I_{REF}$ 377 (and the enable signal indicates that the bleeder circuit is enabled). As such, an edge is detected closer to time $t_1$ 374 as opposed to time $t_2$ 375.

Figure 4:
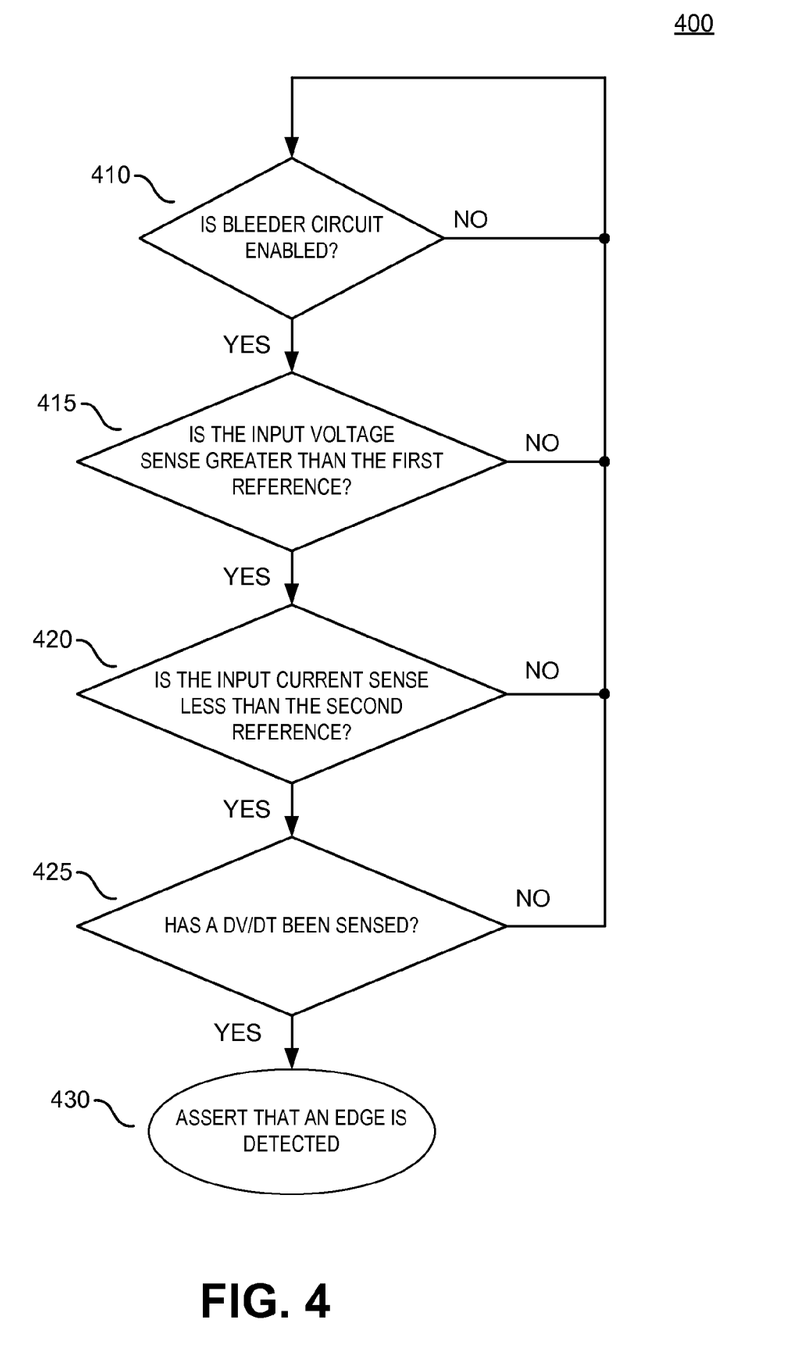
FIG. 4 is a flow diagram illustrating an example method for determining a trailing edge in an input waveform in accordance with an example of the present invention.

FIG. 4 is a flow diagram illustrating an example process 400 for detecting an edge in an input waveform in accordance with an example of the present invention. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

In process block 410, it is determined whether the bleeder circuit is enabled. If the bleeder circuit is not enabled, the process returns to process block 410. If the bleeder circuit is enabled, the process proceeds to block 415. In block 415, the input voltage sense signal (e.g. input voltage sense signal 142) is compared with a first reference (e.g. $V_{REF}$ 372). If the input voltage sense signal is greater than the first reference, the process proceeds to block 420, otherwise the process returns to block 410. Continuing to block 420, the input current sense signal (e.g. input current sense signal 142) is compared to a second reference (e.g. $I_{REF}$ 377). If the input current sense signal is less than the second reference, the process proceeds to block 425, otherwise the process returns to block 410. At block 425, it is determined if the input voltage sense signal has a negative slope. If no negative slope is detected, then the process returns to block 410. If the input voltage sense signal also has a negative slope, then process continues to block 430 where an edge signal asserts that an edge has been detected.

Figure 5:
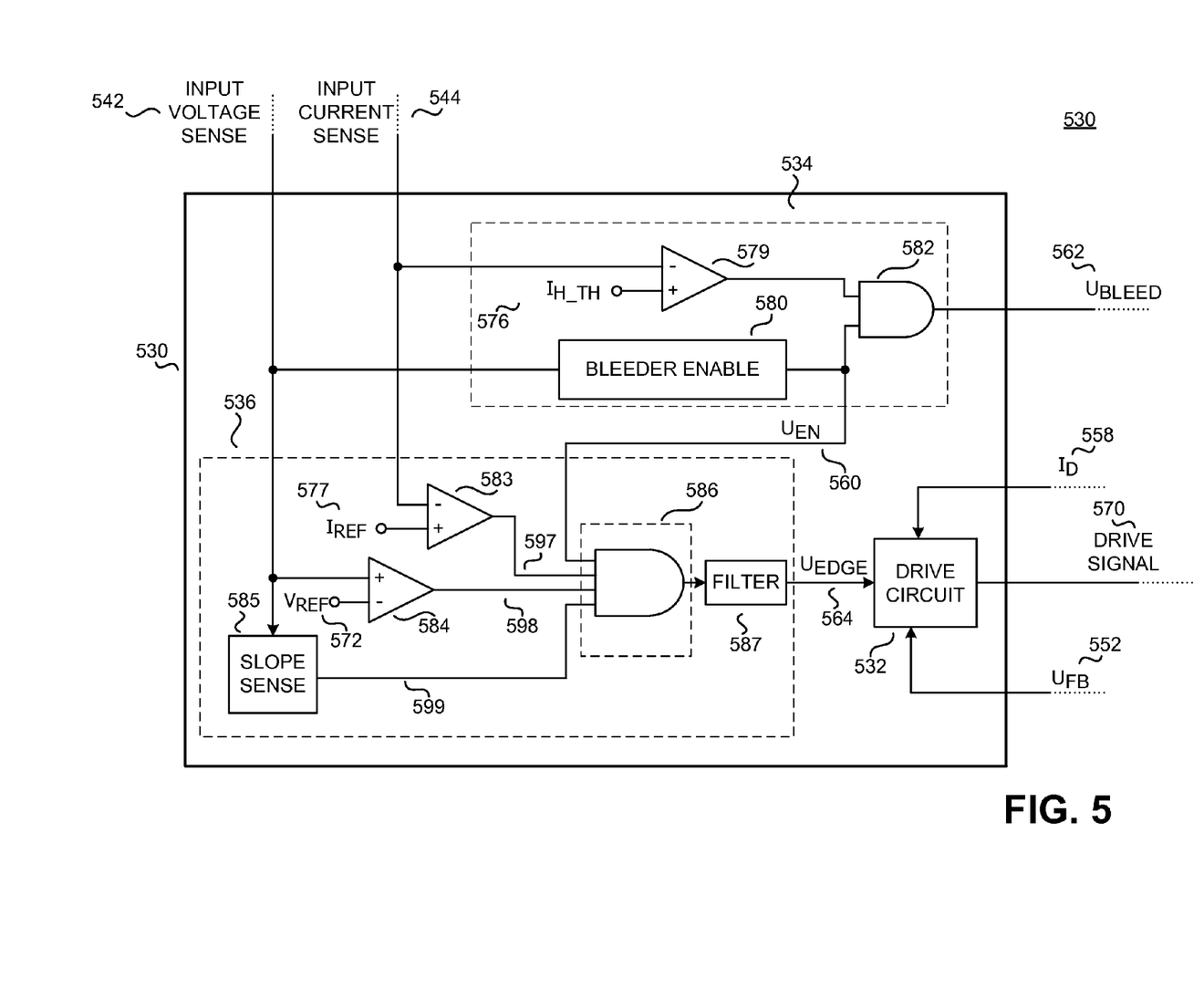
FIG. 5 is a functional block diagram of an example controller in accordance with an example of the present invention.

FIG. 5 illustrates an example controller 530 including a drive circuit 532, bleeder control circuit 534, and an edge detection circuit 536. Bleeder control circuit 534 is shown as including comparator 579, bleeder enable circuit 580, and AND gate 582. Edge detection circuit 536 is shown as including comparators 583 and 584, slope sense circuit 585, an edge driver circuit 586, and a filter 587. In FIG. 5, edge driver circuit 586 includes an AND gate. Further illustrated in FIG. 5 are input voltage sense signal 542, input current sense signal 544, enable signal $U_{EN}$ 560, bleeder control signal $U_{BLEED}$ 562, switch current sense signal 558, feedback signal $U_{FB}$ 552, and drive signal 570. It should be appreciated that similarly named and numbered elements couple and function as described above.

Bleeder control circuit 534 is coupled to receive the input voltage sense signal 542 and input current sense signal 544. Comparator 579 is coupled to receive the input current sense signal 544 at its inverting input and the threshold $I_{H\_TH}$ 576 at its non-inverting input. In one example, the output of comparator 579 goes logic high when input current sense signal 544 is lower than threshold $I_{H\_TH}$ 576. The bleeder enable circuit 580 is coupled to receive the input voltage sense signal and output the enable signal $U_{EN}$ 560. In one example, the enable signal $U_{EN}$ 560 may be logic high when input voltage sense signal 542 is less than first reference $V_{REF}$ 572 for less than a given amount of time. Once the enable signal $U_{EN}$ 560 transitions to a logic high value, the enable signal $U_{EN}$ 560 may remain at a logic high value as long as an edge is detected. In another example, the enable signal $U_{EN}$ 560 may be set to a logic high value to enable the bleeder at start-up of the controller and power converter. In another example, the bleeder enable circuit 580 may output a logic high value when a fast slope (negative or positive) is detected in the input voltage sense signal 542. The AND gate 582 is coupled to receive the output of comparator and the enable signal $U_{EN}$ 560. The output of AND gate 582 is the bleeder control signal $U_{BLEED}$ 562. The enable signal $U_{EN}$ 560 is also coupled to be received by the edge detection circuit 536.

Edge detection circuit 536 is coupled to receive the input voltage sense signal 542, the input current sense signal 544, and the enable signal $U_{EN}$ 560. Comparator 584 is coupled to receive the input voltage sense signal 542 at its non-inverting input and the first reference $V_{REF}$ 572 at its inverting input. Comparator 584 is coupled to assert a first output signal 598 in response to input voltage sense signal 542 being greater than the first reference $V_{REF}$ 572. Comparator 583 is coupled to receive the input current sense signal 544 at its inverting input and the second reference $I_{REF}$ 577 at its non-inverting input. Comparator 583 is coupled to assert a second output signal 597 in response to input current sense signal 544 being less than the second reference $I_{REF}$ 577. Slope sense module 585 is illustrated as receiving the input voltage sense signal 542 and outputting slope signal 599 when input voltage sense signal 542 decreases over time. In one example, slope sense module 585 is a digital voltage tracker that samples input voltage sense signal 542 at a time interval and asserts slope signal 599 based on analyzing the samples stored in slope sense module 585 over a time period that is larger than the time interval (to allow slope sense module 585 to store multiple samples to analyze).

The AND gate of edge driver circuit 586 is illustrated as being coupled to receive the outputs of comparator 583 and 584, slope signal 599, and the enable signal $U_{EN}$ 560. The output of the AND gate is then received by the filter 587. In one example, the output of the AND gate is the edge signal $U_{EDGE}$ 564. The filter 587 may receive and delay the edge signal $U_{EDGE}$ 564 by the time threshold $T_{TH}$ (illustrated as $T_{TH}$ 378 in FIG. 3). Similar to what is described above, the drive circuit 532 is coupled to receive the feedback signal 552, switch current sense signal 558, the edge signal $U_{EDGE}$ 564 to output the drive signal 570 and control switching of the power switch.

In operation, the bleeder control circuit 534 controls switching of the switch 140 of the bleeder 109. The bleeder control signal $U_{BLEED}$ 562 may be a rectangular pulse waveform with varying lengths of logic high and logic low sections. In one example, logic high corresponds to turning the switch 140 on while logic low corresponds to turning the switch 140 off. When the input current sense signal 544 has gone below the threshold $I_{H\_TH}$ 576, the output of comparator 579 is logic high (indicating that the switch 140 of the bleeder 109 should turn on to provide additional current to keep the current in the dimmer circuit above the threshold). However, the bleeder control signal $U_{BLEED}$ 562 does not transition to a logic high value unless the enable signal $U_{EN}$ 560 is also logic high. In one example, the enable signal $U_{EN}$ 560 may be logic high when input voltage sense signal 542 is less than first reference $V_{REF}$ 572 for less than a given amount of time. Once the enable signal $U_{EN}$ 560 transitions to a logic high value, the enable signal $U_{EN}$ 560 may remain at a logic high value as long as an edge is detected. In another example, the enable signal $U_{EN}$ 560 may be set to a logic high value to enable the bleeder at start-up of the controller and power converter. In another example, the bleeder enable circuit 580 may output a logic high value when a fast slope (negative or positive) is detected in the input voltage sense signal 542. The enable signal $U_{EN}$ 560 may remain logic high as long as a dimmer circuit is detected.

Similarly, the edge signal $U_{EDGE}$ 564 transitions to a logic high value indicating that an edge is detected when the inputs of the AND gate of edge driver circuit 586 are logic high. Comparator 583 outputs a logic high value when the input current sense signal 544 is less than the second reference $I_{REF}$ 577. Comparator 584 outputs a logic high value when the input voltage sense signal 542 is greater than the first threshold $V_{REF}$ 572. Slope sense 585 is coupled to receive the input voltage sense signal 542 and determine if the input voltage $V_{IN}$ has a positive or negative slope. For the example shown in FIG. 5, the output of slope sense 585 is logic high when the input voltage $V_{IN}$ has a negative slope. When each of these conditions occur, and the enable signal $U_{EN}$ 560 is asserted, the edge signal $U_{EDGE}$ 564 indicates that an edge has been detected.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A controller for a power converter, the controller comprising:
   an edge detection circuit including:
      a first circuit coupled to receive a voltage sense signal representative of an input voltage of the power converter, wherein the first circuit is coupled to compare the voltage sense signal to a first reference;

a second circuit coupled to receive a current sense signal representative of an input current of the power converter, wherein the second circuit is coupled to compare the current sense signal to a second reference;

a slope sense circuit coupled to receive the voltage sense signal, wherein the slope sense circuit is coupled to measure a slope of the voltage sense signal over time; and an edge driver circuit coupled to generate an edge signal in response to the first circuit, the second circuit, and the slope sense circuit, wherein the edge signal indicates that an edge has been determined when the voltage sense signal is greater than the first reference, the current sense signal is lower than the second reference, and the slope is negative; and a drive circuit coupled to output a drive signal in response to the edge signal, wherein the drive signal is for controlling a switch coupled to regulate an output of the power converter.

2. The controller of claim 1 further comprising a bleeder control circuit, wherein the bleeder control circuit comprises a bleeder enable circuit coupled to determine if a bleeder circuit is enabled, wherein the bleeder enable circuit is coupled to generate an enable signal in response to the voltage sense signal being less than the first reference for less than a given amount of time.

3. The controller of claim 2, wherein the edge driver circuit further generates the edge signal in response in response to the enable signal.

4. The controller of claim 2, wherein the bleeder control circuit outputs a bleeder control signal when the enable signal is asserted and the current sense signal is lower than a threshold.

5. The controller of claim 1, wherein the first circuit comprises a first comparator coupled to receive the voltage sense signal and the first reference, wherein the first comparator is coupled to compare the voltage sense signal to the first reference.

6. The controller of claim 1, wherein the second circuit comprises a second comparator coupled to receive the current sense signal and the second reference, wherein the second comparator is coupled to compare the current sense signal to the second reference.

7. The controller of claim 1, wherein the edge driver circuit includes a logic gate coupled to receive an output of the first circuit, an output of the second circuit, and an output of the slope sense circuit.

\* \* \* \* \*